(12) United States Patent
Noguchi

(10) Patent No.: US 6,875,708 B2
(45) Date of Patent: Apr. 5, 2005

(54) METHOD OF PRODUCING DIAMOND FILM AND DIAMOND FILM PRODUCED THEREBY

(75) Inventor: Hitoshi Noguchi, Gunma (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 103 days.

(21) Appl. No.: 10/141,009

(22) Filed: May 6, 2002

(65) Prior Publication Data

US 2002/0168836 A1 Nov. 14, 2002

(30) Foreign Application Priority Data

May 11, 2001 (JP) .......................... 2001-141123

(51) Int. Cl.[7] .............................. H01L 21/469
(52) U.S. Cl. .................. 438/778; 438/779; 438/780
(58) Field of Search ........................... 438/778, 779, 438/720, 735, 694, 706–710, 680, 496

(56) References Cited

U.S. PATENT DOCUMENTS 5,112,775 A * 5/1992 Iida et al. ................. 438/105
5,782,975 A * 7/1998 Linn ........................ 117/89
5,964,942 A * 10/1999 Tanabe et al. ............. 117/87

OTHER PUBLICATIONS

Kenji Marumoto et al., "Fabrication of Diamond Membranes for X–Ray Masks by Hot–Filament Mehtod", Jpn. J. Appl. Phys. vol. 31 (1992) pp. 4205–4209 Part 1, No. 12B Dec. 1992.

* cited by examiner

Primary Examiner—Dung A. Le
(74) Attorney, Agent, or Firm—Hogan & Hartson, LLP

(57) ABSTRACT

There is disclosed a method of producing a diamond film formed on a substrate, wherein at least after a film (dopant layer) containing doping elements is formed on a surface of the substrate, a vapor phase synthetic diamond film is formed on the dopant layer, and the dopant layer contains diamond particles, which become sources of diamond nuclei, in addition to doping elements, and also disclosed a diamond film produced by the method. There can be provided a method of producing a diamond film that a diamond film having lowered electric resistance can be produced, and also provided a diamond film produced by the method.

26 Claims, 2 Drawing Sheets (A)

(B)

METHOD OF PRODUCING DIAMOND FILM AND DIAMOND FILM PRODUCED THEREBY

BACKGROUND OF THE INVENTION

1. Field of the Invention

The present invention relates to a method of producing a diamond film and a diamond film produced by the method.

2. Description of the Related Art

Recently, use of a diamond film formed on a substrate has been commonly considered by making use of peculiar characteristics of diamond. Diamond has been used for a mask member for exposure in lithography technique used in the manufacture of semiconductor devices, a substrate for a surface acoustic wave (SAW) device, or a grinding and polishing tool, for example.

Since diamond is excellent in Young's modulus, etching resistance, high energy ray radiation resistance, or the like, interest has been shown towards diamond to utilize it for a mask membrane for lithography with X-ray or electron beam, which can form ultrafine pattern of 100 nm or less.

As to a method of producing a diamond film, there have been known methods using DC arc discharge, DC glow discharge, combustion flame, high frequency (radiofrequency), microwave, hot-filament, or the like. Among them, the microwave CVD method and hot-filament CVD method are commonly used, because each method can form the film having a large area and good crystallinity. When forming a film of a vapor phase synthetic diamond by the above CVD methods, a mixed gas, in which a carbon contained gas such as methane, ethylene, acetylene or carbon monoxide in general is diluted by hydrogen gas, is commonly used as a source gas. However, when this hydrogen-diluted carbon contained gas is used as a source gas for vapor phase reaction, the value of electric resistance of the obtained diamond film is determined, with the result that it shows a range of $10^9$ to $10^{15}$ Ω·cm.

If a diamond film is used for a mask membrane for lithography, particularly for lithography with X-ray or electron beam, it is necessary to conduct a defect inspection by irradiating an electron beam thereon. However, in the case that a diamond film is obtained by the above CVD methods of which source gas is a hydrogen-diluted carbon contained gas, it suffers from a problem that since its electric resistance is high as shown the above-described range, charged particles are stored therein, so that a charge-up phenomenon is easily generated and the defect inspection is not conducted promptly and precisely.

Besides, in the case that a diamond film is actually used for a mask membrane for lithography with electron beam, if its electric resistance is high, a charge-up phenomenon is also generated, so that it is difficult to conduct a high-precision transcription.

In order to reduce an electric resistance of a diamond film for avoiding such a charge-up phenomenon, it is suggested that when forming a diamond film, a dopant gas such as diborane ($B_2H_6$) or phosphine ($PH_3$) is introduced into a reaction container, and vapor phase reaction is conducted by using the dopant gas and the aforementioned hydrogen-diluted carbon contained gas.

Specifically, it was reported that in the case that vapor phase reaction is conducted by introducing a hydrogen-diluted methane gas containing diborane as a dopant into a reaction container so that a P-type diamond film is formed, electric resistance of the diamond film can be reduced to $10^{-2}$ Ω·cm (K. Marumoto, J. Appli. Phys., 31 (1992) 4205–4209).

However, in the case that diborane is used as a dopant source of boron, its threshold limit value is 0.1 ppm and phosphine is used thereas, it is 0.3 ppm, so that there is anxious about effect on the human body. Namely, in the case of a doping with these gases, any leakage is not permitted, and thus an additional safety device or the like must be provided, so that too much cost is required. Meanwhile, because of explosive nature of these gases, they must be treated with the greatest care, and an apparatus also must be have measures against the explosive nature. Therefore, it is preferable that a doping with these gases is avoided as much as possible.

SUMMARY OF THE INVENTION

The present invention has been accomplished to solve the above-mentioned problems, and an object of the present invention is to provide a method of producing a diamond film wherein the diamond film of which electric resistance is lowered can be produced with ease and low cost without any extra device in the production thereof, and to provide the diamond film produced by the method.

To achieve the above object, according to the present invention, there is provided a method of producing a diamond film formed on a substrate, wherein at least after a film (dopant layer) containing doping elements is formed on a surface of the substrate, a vapor phase synthetic diamond film is formed on the dopant layer.

As described above, in the production of the vapor phase diamond film, at least after a dopant layer containing doping elements is formed on a surface of the substrate, the vapor phase synthetic diamond film is formed on the dopant layer, so that the diamond film of which electric resistance is reduced can be obtained. Besides, since the dopant layer is formed on the substrate, a doping source can be changed from a gas into a dopant layer. Accordingly, without any additional device for safety, the diamond film of which electric resistance is reduced can be easily obtained.

In this case, it is preferable that the dopant layer contains diamond particles, which become sources of diamond nuclei, in addition to doping elements.

As described above, the dopant layer contains diamond particles, which become sources of diamond nuclei, in addition to doping elements, so that generation density of nuclei in a diamond film can be increased, and a vapor phase synthetic diamond film can be easily formed.

It is preferable that the dopant layer on the surface of the substrate is formed by applying a solution, in which one or more of solids of B, $B_2O_3$, $BCl_3$, BN, Ga, $GaCl_3$, P, $P_2O_5$, $PCl_3$, As, $As_2O_3$, $AsCl_3$, Sb, $Sb_2O_3$, $SbCl_5$ are dissolved, or a dispersion liquid, in which one or more of the above solids are dispersed, to the substrate, or formed by a sputtering method, which uses one or more of above solids as a target.

According to this, the dopant layer is easily formed on the surface of the substrate without problems in work, so that the diamond film of which electric resistance is reduced can be obtained with low cost.

On this occasion, it is preferable that the dopant layer on the surface of the substrate is formed by applying a suspension, which is obtained by adding diamond particles in a solution in which one or more of solids of B, $B_2O_3$, $BCl_3$, BN, Ga, $GaCl_3$, P, $P_2O_5$, $PCl_3$, As, $As_2O_3$, $AsCl_3$, Sb, $Sb_2O_3$, $SbCl_5$ are dissolved, or in a dispersion liquid in which one or more of above solids are dispersed, to the substrate. It is also preferable that after the dopant layer is formed on the surface of the substrate, the surface of the dopant layer is pre-treated by diamond particles for seeding residual diamond particles before formation of a diamond film.

As described above, in the formation of the dopant layer, a suspension, which is obtained by adding diamond particles in a solution in which one or more of the above solids are dissolved, or in a dispersion liquid in which one or more of the above solids are dispersed, is applied to the substrate, or after the formation of the dopant layer, the surface of the dopant layer is pre-treated by diamond particles for seeding residual diamond particles by means of application of the diamond suspension, supersonic treatment with the diamond suspension, scratching treatment with diamond particles, treatment in a fluidized bed of diamond particles, or the like, so that generation density of diamond nuclei on the dopant layer can be increased and a vapor phase synthetic diamond film can be easily formed.

Moreover, it is preferable that heat treatment is conducted in a final step of formation of a dopant layer.

As described above, heat treatment is conducted in the final step of the formation of the dopant layer, so that unnecessary materials existed in the dopant layer can be eliminated to increase the purity of the film, and the dopant layer can be formed uniformly.

On this occasion, it is preferable that a material used for a substrate on which a dopant layer is formed is selected from any one of silicon, silicon oxide ceramics, silicon nitride ceramics, or silicon coated with silicon oxide or silicon nitride on its surface.

As described above, if the material used for the substrate on which the dopant layer is formed is selected from any one of silicon, silicon oxide ceramics, silicon nitride ceramics, or silicon coated with silicon oxide or silicon nitride on its surface, since a certain processing can make a surface of the substrate made of any one of the above materials significantly smooth, not only a dopant layer but also a diamond film can be formed smoothly and uniformly.

Furthermore, according to the present invention, there can be provided a diamond film of which resistance is lowered by the aforementioned production method, specifically a diamond film of which electric resistance is $10^7$ Ω·cm or less.

As described above, as compared to a conventional diamond film, the diamond film produced by the above production method can certainly have a lower electric resistance and good uniformly. According to this, if the diamond film of the present invention is used for a lithography with X-ray or electron beam, or the like, a charge-up phenomenon in a defect inspection for a mask membrane to be used can be avoided, and as a result, an excellent diamond mask membrane for lithography can be produced. Further, in the case that the diamond film is actually used as a diamond mask membrane for lithography with electron beam, a charge-up phenomenon can be avoided, and a high-precision pattern can be transcribed effectively, so that further high-precision and high-integrated semiconductor devices can be made.

According to the present invention, a doping source is changed from a gas into a dopant layer formed on a surface of a substrate, so that there is no problem of handling materials to be used in production of a diamond film, and the diamond film of which electric resistance is lowered can be obtained with ease and low cost without any extra device. Besides, the dopant layer is uniformly formed on the substrate, so that the diamond film with high uniformity of doping concentration can be obtained.

Further, electric resistance of the diamond film of the present invention can be controlled to $10^7$ Ω·cm or less, so that a charge-up phenomenon, which is caused in a defect inspection for a mask membrane required in the case that a diamond film is used for a mask membrane for lithography, particularly for lithography with X-ray or electron beam, can be certainly avoided. According to this, a high-quality diamond mask membrane for lithography can be produced. Furthermore, in the case that the diamond film is actually used for a diamond mask membrane for lithography with electron beam, a charge-up phenomenon can be avoided, so that a high-precision pattern can be transcribed effectively.

DESCRIPTION OF THE INVENTION AND A PREFERRED EMBODIMENT

The present invention will be described below in detail with reference to drawings, but not limited thereto.

The inventors found that when a vapor phase synthetic diamond film is formed, it can serve as a doping toward the diamond film that a film (dopant layer) containing a doping element is previously formed on a surface of a substrate, and then a vapor phase synthetic diamond film is formed on the dopant layer, and thereby they completed the present invention. According to this, there is no problem of handling materials to be used in production of the diamond film, and the diamond film of which electric resistance is lowered can be produced with ease and low cost without any extra device.

Figure 1:
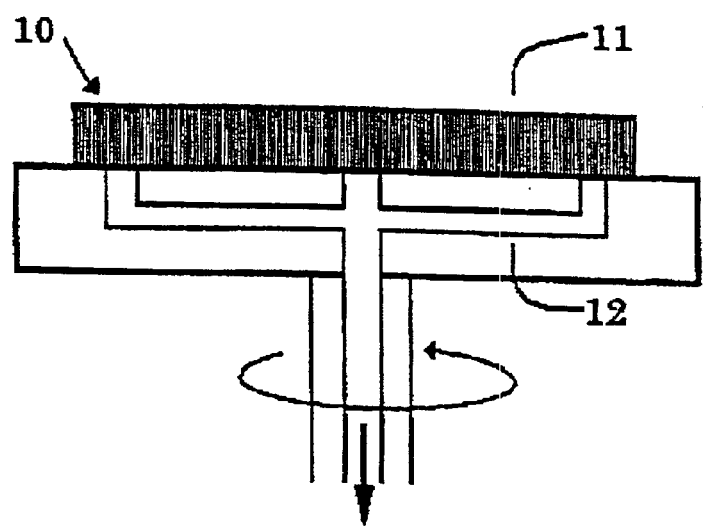
FIG. 1 is a schematic view of apparatuses for forming a dopant layer used in the present invention, (A) shows a spin coating apparatus, and (B) shows a sputtering apparatus for forming a film.
Figure 1:
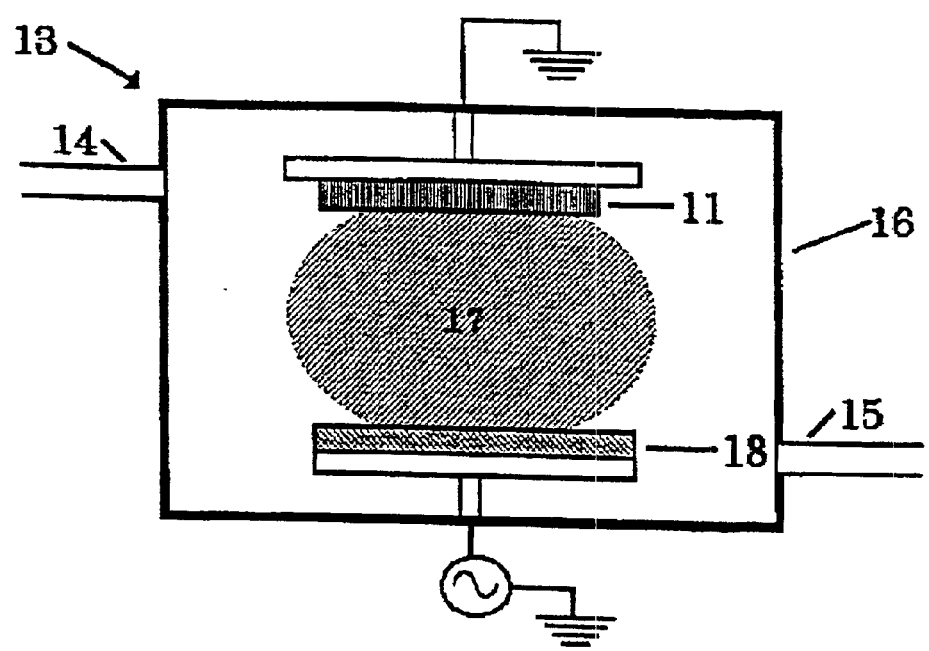
Figure 2:
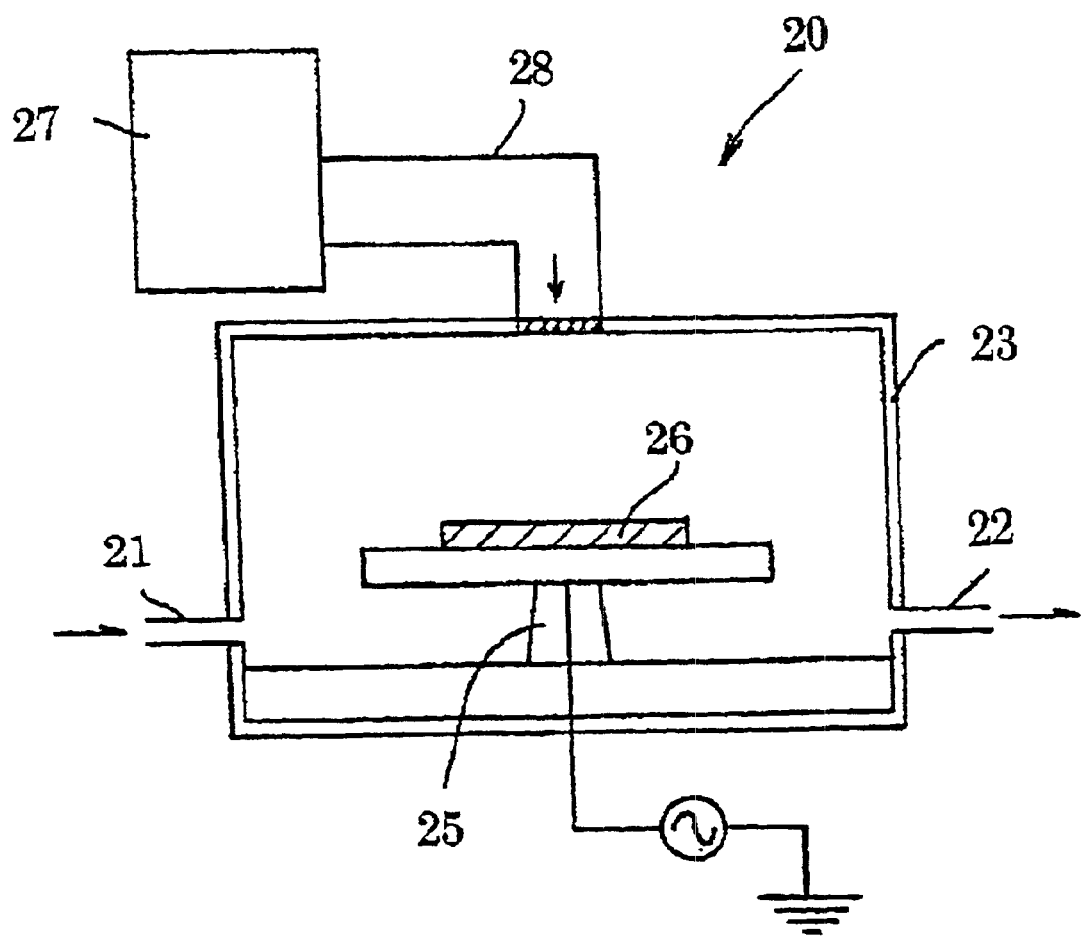
FIG. 2 is a schematic view showing a microwave CVD apparatus.

FIG. 1 shows apparatuses of the present invention for forming a dopant layer, FIG. 1(A) shows a spin coating apparatus, and FIG. 1(B) shows a sputtering apparatus for forming a film. FIG. 2 shows an apparatus for a microwave CVD method, which is a typical method for forming a diamond film.

As to a material of the substrate on which a dopant layer is formed, a silicon or ceramics such as silicon oxide ceramics or silicon nitride ceramics is preferably used. Additionally, a silicon with a surface coated with ceramics such as silicon oxide ceramics or silicon nitride ceramics can be also used. As described above, if the material of the substrate is selected from any one of above materials, a substrate having a smooth surface can be obtained by a certain processing, and thereby not only a dopant layer but also a diamond film can be formed smoothly and uniformly on the substrate.

First, in formation of a dopant layer, electrical conductivity type of a P-type or N-type is selected depending on its purpose. In the case of forming a P-type dopant layer, a solution, in which one or more of solids of B, $B_2O_3$, $BCl_3$, BN, Ga, $GaCl_3$ are dissolved, or a dispersion liquid, in which one or more of above solids are dispersed, is dropped on a surface of a substrate. In the case of forming an N-type dopant layer, a solution, in which one or more of solids of P, $P_2O_5$, $PCl_3$, As, $As_2O_3$, $AsCl_3$, Sb, $Sb_2O_3$, $SbCl_5$ are dissolved, or a dispersion liquid, in which one or more of above solids are dispersed, is dropped on a front surface of a substrate. Subsequently, in either case, if the substrate is wafer-shaped, by using a spin coating apparatus 10 shown in FIG. 1(A), a back surface of the substrate 11 is held by vacuum sucking by evacuating a passage 12 connected to a vacuum device (not shown), and this substrate 11 held by vacuum sucking is rotated in order to uniform the thickness of the dropped solution. Meanwhile, in the case that the uniformity of the thickness of the dropped solution is not considered, it is sufficient only to immerse the substrate in the dispersion liquid.

Further, by using a sputtering apparatus 13 as shown in FIG. 1(B), a dopant layer can be formed by a sputtering method. Namely, a target electrode material 18 installed opposite to the substrate 11 is sputtered with plasma to form a film on a front surface of the substrate. In the case of forming a P-type dopant layer, one or more of solids of B, $B_2O_3$, $BCl_3$, BN, Ga, $GaCl_3$ are used as the target electrode material 18, and in the case of forming an N-type dopant layer, one or more of solids of P, $P_2O_5$, $PCl_3$, As, $As_2O_3$, $AsCl_3$, Sb, $Sb_2O_3$, $SbCl_5$ are used as the target electrode material 18. After the target electrode material 18 and the substrate 11 is set in a chamber 16, the chamber 16 is exhausted from a gas outlet pipe 15 by a vacuum pump to reduce the pressure inside the chamber 16 to $10^{-7}$ Torr. Then, a gas (an argon gas, for example) is introduced from a gas inlet pipe 14 to the chamber 16, discharge is conducted by applying a voltage of 13.56 MHz to the electrode, and a plasma 17 is generated to form a desired dopant layer.

In the case of forming a diamond film, if diamond particles exist on a surface of a substrate, generation density of diamond nuclei is increased, so that a vapor phase synthetic diamond film can be easily formed. Consequently, in the case of forming a dopant layer on a surface of the substrate, a suspension, which is obtained by adding diamond particles in a solution, in which one or more of solids of B, $B_2O_3$, $BCl_3$, BN, Ga, $GaCl_3$, P, $P_2O_5$, $PCl_3$, As, $As_2O_3$, $AsCl_3$, Sb, $Sb_2O_3$, $SbCl_5$ are dissolved, or in a dispersion liquid, in which one or more of above solids are dispersed, is preferably applied to the surface of the substrate. In addition, after a dopant layer is formed on the surface of the substrate, it is also effective that the surface of the dopant layer is pre-treated by diamond particles for seeding residual diamond particles by means of subjecting to application of a diamond suspension, supersonic treatment with a diamond suspension, scratching treatment with diamond particles, treatment in a fluidized bed of diamond particles, or the like. As described above, diamond particles are included in a dopant layer or the surface of the dopant layer is pre-treated by diamond particles for seeding residual diamond particles, so that a dense and high-quality diamond film can be easily formed on a dopant layer.

Besides, if heat treatment is conducted in a final step of the formation of the dopant layer, unnecessary materials existed in the dopant layer can be eliminated, and the dopant layer can be formed uniformly. Accordingly, since the quality of the diamond film formed on the dopant layer can be further improved, the heat treatment is preferably conducted.

After the dopant layer is formed on the substrate, a vapor phase synthetic diamond film is formed on the dopant layer by using a microwave CVD apparatus 20 as shown in FIG. 2. In this apparatus, a substrate stage 25 equipped with a heating means such as a heater or the like is located in a chamber 23 provided with a gas inlet pipe 21 and a gas outlet pipe 22. And a microwave source 27 is connected to a microwave introducing window via a waveguide 28 to generate plasma in the chamber 23.

By using such an apparatus described above, a substrate 26 on which a diamond film is to be formed is placed on the substrate stage 25, and the chamber 23 is exhausted with a rotary pump to reduce its pressure to $10^{-3}$ Torr or less. Next, a source gas, for example a hydrogen-diluted gas, is introduced at a desired flow rate from the gas inlet pipe 21 to the chamber 23. After a valve of the gas outlet pipe 22 is adjusted to make the pressure in the chamber 23 30 Torr, a microwave is applied into the chamber 23 from the microwave source 27 and the waveguide 28 to generate plasma in the chamber 23, so that a diamond film is formed on the substrate 26.

After the diamond film is formed on the substrate, processing such as etching for removing the substrate is conducted depending on its purpose in order to produce a mask member for exposure or the like. For example, a predetermined region of a back surface of the substrate on which a diamond film is formed is removed with an etchant such as potassium hydroxide solution, so that a diamond mask membrane for exposure can be obtained.

As to method of removing with an etchant, it is sufficient to conduct a conventionally known method. For example, it can be conducted by dipping the substrate on which a diamond film is formed according to the above-mentioned method in a bath containing an etchant.

As described above, a doping source is changed from a gas into a dopant layer formed on a surface of a substrate, so that there is no problem of handling materials to be used in production of a diamond film, and the diamond film of which electric resistance is lowered can be easily obtained. Additionally, a dopant layer is uniformly formed on a substrate, so that the diamond film with high uniformity of doping concentration can be obtained. In this case, the electric resistance of the diamond film can be controlled to $10^7$ Ω·cm or less by adjusting the concentration and thickness of the dopant layer.

As described above, the electric resistance of the diamond film is controlled to $10^7$ Ω·cm or less, so that a charge-up phenomenon, which occurs in a defect inspection for a mask membrane required in the case that the diamond film is used as a mask membrane for lithography, particularly for lithography with X-ray or electron beam can be avoided certainly. Accordingly, a high-quality diamond mask membrane for lithography can be produced. Further, in the case that the diamond film is actually used as a diamond mask membrane for lithography with electron beam, a charge-up phenomenon can be avoided, so that a high-precision pattern can be transcribed effectively.

EXAMPLE

The following example and comparative example are being submitted to further explain the present invention, but the present invention is not limited thereto.

Example

A double side polished silicon wafer having a diameter of 100 mm, a thickness of 2 mm and orientation <100> was prepared as a substrate, and a dopant layer was formed on a surface of the silicon wafer. First, the silicon wafer was set on a spin coating apparatus, it was held by sucking on its back surface, a $B_2O_3$ solution (product name: 6M-10, PBF of Tokyo Ohka Kogyo Co., Ltd.), which was made by dissolving $B_2O_3$ into a organic solvent, was dropped at 50 ml on the front surface thereof, and the silicon wafer was rotated for 30 seconds at 3000 rpm so that the $B_2O_3$ solution was applied uniformly on the substrate. Then, the silicon wafer was baked for 1 minute at 150° C. on a hot plate and further burnt for 30 minutes at 600° C. in oxygen atmosphere so that a dopant layer of $B_2O_3$ was formed on the surface of the silicon substrate. In order to increase generation density of diamond nuclei on the dopant layer, a suspension containing diamond particles (cluster diamonds having an average particle size of 50 nm) was applied by spin coating as in the above-described process of the $B_2O_3$ solution. At that time, baking or burning was not conducted.

After conducting the above treatments, the substrate was set on a substrate table in a chamber of a microwave CVD apparatus. Next, the pressure in the chamber was reduced to $10^{-3}$ Torr or less by exhausting air with a rotary pump, and then a mixed gas of methane gas, hydrogen gas and oxygen gas was supplied thereto from a gas inlet pipe. Each of gasses was supplied so that methane gas was 40.0 sccm, hydrogen gas was 955.0 sccm and oxygen gas was 5.0 sccm. The volume ratio thereof was methane gas/hydrogen gas/oxygen gas=4.0/95.5/0.5. Then, the pressure in the chamber was controlled to 30 Torr by adjusting a valve of the gas outlet pipe, and a microwave having a electric power of 3000 W was applied to the chamber to generate plasma, and the formation of a diamond film was conducted for 5 hours, so that a diamond film doped with boron was obtained on the substrate. In the film formation, the substrate generated heat due to microwave absorption, and surface temperature of the substrate reached to 850° C.

Thus obtained diamond film doped with boron was subjected to a polishing process in order that the film could have a thickness of 0.5 $\mu$m and a surface roughness of 5 nm in Ra, so that a mask substrate for lithography with electron beam was obtained, and a stencil-type mask membrane for lithography with electron beam was produced by use of the mask substrate. Next, electric resistance of the diamond film was measured, with the result that it was 3 $\Omega$·cm. Accordingly, a charge-up phenomenon was not generated through a defect inspection for the mask membrane. Further, even when the diamond film was actually used as a mask membrane for lithography with electron beam, a charge-up phenomenon was not generated, and a high-precision pattern was able to be transcribed stably.

Comparative Example

A diamond film was formed under the same condition as the Example except the formation of a dopant layer. Namely, a diamond film was formed on a surface of the substrate on which a suspension containing diamonds was applied by spin coating, and the substrate was subjected to a polishing process in order that the film could have a thickness of 0.5 $\mu$m and a surface roughness of 5 nm in Ra, so that a mask substrate for lithography with electron beam was obtained. Then, a stencil-type mask membrane for lithography with electron beam was produced by use of the mask membrane, and electric resistance of the diamond film was measured, with the result that it was $10^9$ $\Omega$·cm or more. Further, a charge-up phenomenon was generated through a defect inspection, so that the defect inspection was not able to be conducted, and thus the mask membrane lacks reliability. When the diamond film was actually used as a mask membrane for lithography with electron beam, a charge-up phenomenon was generated, and thus only a low-precision and instable pattern was able to be transcribed.

The present invention is not limited to the above-described embodiment. The above-described embodiment is a mere example, and those having substantially the same structure as that described in the appended claims and providing the similar action and effects are included in the scope of the present invention.

What is claimed is:

1. A method of producing a diamond film, wherein at least after a dopant layer containing doping elements is formed a doping source changing from gas into the dopant layer on a surface of a substrate, a vapor phase synthetic diamond film is formed on the dopant layer.

2. The method of producing a diamond film according to claim 1 wherein the dopant layer contains diamond particles, which become sources of diamond nuclei, in addition to doping elements.

3. The method of producing a diamond film according to claim 1 wherein the dopant layer formed on the surface of the substrate is formed by applying a solution, in which one or more of solids of B, $B_2O_3$, $BCl_3$, BN, Ga, $GaCl_3$, P, $P_2O_5$, $PCl_3$, As, $As_2O_3$, $AsCl_3$, Sb, $Sb_2O_3$, $SbCl_5$ are dissolved, or a dispersion liquid, in which one or more of above solids are dispersed, to the substrate.

4. The method of producing a diamond film according to claim 2 wherein the dopant layer formed on the surface of the substrate is formed by applying a solution, in which one or more of solids of B, $B_2O_3$, $BCl_3$, BN, Ga, $GaCl_3$, P, $P_2O_5$, $PCl_3$, As, $As_2O_3$, $AsCl_3$, Sb, $Sb_2O_3$, $SbCl_5$ are dissolved, or a dispersion liquid, in which one or more of above solids are dispersed, to the substrate.

5. The method of producing a diamond film according to claim 1 wherein the dopant layer formed on the surface of the substrate is formed by a sputtering method, which uses one or more of solids of B, $B_2O_3$, $BCl_3$, BN, Ga, $GaCl_3$, P, $P_2O_5$, $PCl_3$, As, $As_2O_3$, $AsCl_3$, Sb, $Sb_2O_3$, $SbCl_5$ as a target.

6. The method of producing a diamond film according to claim 2 wherein the dopant layer formed on the surface of the substrate is formed by a sputtering method, which uses one or more of solids of B, $B_2O_3$, $BCl_3$, BN, Ga, $GaCl_3$, P, $P_2O_5$, $PCl_3$, As, $As_2O_3$, $AsCl_3$, Sb, $Sb_2O_3$, $SbCl_5$ as a target.

7. The method of producing a diamond film according to claim 1 wherein the dopant layer formed on the surface of the substrate is formed by applying a suspension, which is obtained by adding diamond particles in a solution in which one or more of solids of B, $B_2O_3$, $BCl_3$, BN, Ga, $GaCl_3$, P, $P_2O_5$, $PCl_3$, As, $As_2O_3$, $AsCl_3$, Sb, $Sb_2O_3$, $SbCl_5$ are dissolved, or in a dispersion liquid in which one or more of above solids are dispersed, to the substrate.

8. The method of producing a diamond film according to claim 2 wherein the dopant layer formed on the surface of the substrate is formed by applying a suspension, which is obtained by adding diamond particles in a solution in which one or more of solids of B, $B_2O_3$, $BCl_3$, BN, Ga, $GaCl_3$, P, $P_2O_5$, $PCl_3$, As, $As_2O_3$, $AsCl_3$, Sb, $Sb_2O_3$, $SbCl_5$ are dissolved, or in a dispersion liquid in which one or more of above solids are dispersed, to the substrate.

9. The method of producing a diamond film according to claim 1 wherein after the dopant layer is formed on the surface of the substrate, the surface of the dopant layer is pre-treated by diamond particles for seeding residual diamond particles before forming a diamond film.

10. The method of producing a diamond film according to claim 2 wherein after the dopant layer is formed on the surface of the substrate, the surface of the dopant layer is pre-treated by diamond particles for seeding residual diamond particles before forming a diamond film.

11. The method of producing a diamond film according to claim 1 wherein heat treatment is conducted in a final step of formation of the dopant layer.

12. The method of producing a diamond film according to claim 2 wherein heat treatment is conducted in a final step of formation of the dopant layer.

13. The method of producing a diamond film according to claim 1 wherein a material used for the substrate on which the dopant layer is formed is selected from any one of a silicon, silicon oxide ceramics, silicon nitride ceramics, or silicon with a surface coated with silicon oxide or silicon nitride.

14. The method of producing a diamond film according to claim 2 wherein a material used for the substrate on which the dopant layer is formed is selected from any one of a silicon, silicon oxide ceramics, silicon nitride ceramics, or silicon with a surface coated with silicon oxide or silicon nitride.

15. A diamond film produced by the method of producing a diamond film according to claim 1.

16. A diamond film produced by the method of producing a diamond film according to claim 2.

17. A diamond film produced by the method of producing a diamond film according to claim 3.

18. A diamond film produced by the method of producing a diamond film according to claim 4.

19. A diamond film produced by the method of producing a diamond film according to claim 5.

20. A diamond film produced by the method of producing a diamond film according to claim 6.

21. The diamond film according to claim 15 wherein electric resistance of the diamond film is $10^7$ Ω·cm or less.

22. The diamond film according to claim 16 wherein electric resistance of the diamond film is $10^7$ Ω·cm or less.

23. The diamond film according to claim 17 wherein electric resistance of the diamond film is $10^7$ Ω·cm or less.

24. The diamond film according to claim 18 wherein electric resistance of the diamond film is $10^7$ Ω·cm or less.

25. The diamond film according to claim 19 wherein electric resistance of the diamond film is $10^7$ Ω·cm or less.

26. The diamond film according to claim 20 wherein electric resistance of the diamond film is $10^7$ Ω·cm or less.

* * * * *